United States Patent
Schekulin

(10) Patent No.: US 10,193,464 B2
(45) Date of Patent: Jan. 29, 2019

(54) DC-DC CONVERTER

(71) Applicant: Schmidhauser AG, Romanshorn (CH)

(72) Inventor: Dirk Schekulin, Gais (CH)

(73) Assignee: Schmidhauser AG, Romanshorn (CH)

( * ) Notice: Subject to any disclaimer, the term of this patent is extended or adjusted under 35 U.S.C. 154(b) by 0 days.

(21) Appl. No.: 15/568,514

(22) PCT Filed: Apr. 22, 2016

(86) PCT No.: PCT/EP2016/059059
§ 371 (c)(1),
(2) Date: Oct. 23, 2017

(87) PCT Pub. No.: WO2016/170142
PCT Pub. Date: Oct. 27, 2016

(65) Prior Publication Data
US 2018/0115247 A1    Apr. 26, 2018

(30) Foreign Application Priority Data
Apr. 24, 2015 (DE) .......................... 10 2015 207 605

(51) Int. Cl.
*H02M 1/34* (2007.01)
*H02M 1/32* (2007.01)
(Continued)

(52) U.S. Cl.
CPC .......... *H02M 3/337* (2013.01); *H02H 7/1213* (2013.01); *H02M 1/32* (2013.01);
(Continued)

(58) Field of Classification Search
CPC ............ H02M 1/34; H02M 2001/342; H02M 2001/344; H02M 2001/346;
(Continued)

(56) References Cited

U.S. PATENT DOCUMENTS

| 5,923,547 A | 7/1999 | Mao |
| 7,184,287 B2 * | 2/2007 | Ying ...................... H02M 1/34 363/126 |

(Continued)

FOREIGN PATENT DOCUMENTS

| DE | 10 2012 202 869 A1 | 8/2013 |
| DE | 10 2012 219 365 A1 | 4/2014 |

OTHER PUBLICATIONS

International Search Report (PCT/ISA/210) issued in PCT Application No. PCT/EP2016/059059 dated Jun. 28, 2016 with English translation (five pages).

(Continued)

*Primary Examiner* — Gary L Laxton
(74) *Attorney, Agent, or Firm* — Crowell & Moring LLP

(57) ABSTRACT

A DC-DC converter includes: an output terminal, wherein the output terminal has a first output terminal pin and a second output terminal pin; a number of rectifier elements; a voltage limiting unit having an electrical energy store, wherein the voltage limiting unit is designed to limit voltages across the rectifier elements; and a clocked energy regulator unit which is designed to regulate at a setpoint value energy which is stored in the electrical energy store.

3 Claims, 6 Drawing Sheets

(51) Int. Cl.
*H02M 3/335* (2006.01)
*H02M 3/337* (2006.01)
*H02H 7/12* (2006.01)
*H02M 3/156* (2006.01)
*H02M 7/519* (2006.01)
*H02H 7/125* (2006.01)
*H03K 17/0812* (2006.01)
*H03K 17/284* (2006.01)

(52) U.S. Cl.
CPC ........... *H02M 3/156* (2013.01); *H02M 3/335* (2013.01); *H02M 3/33507* (2013.01); *H02M 3/33546* (2013.01); *H02M 3/33576* (2013.01); *H02M 3/33584* (2013.01); *H02M 3/33592* (2013.01); *H02H 7/125* (2013.01); *H02M 2001/342* (2013.01); *H03K 17/08122* (2013.01); *H03K 17/284* (2013.01); *Y02B 70/1475* (2013.01); *Y02B 70/1491* (2013.01)

(58) Field of Classification Search
CPC ..... H02M 2001/348; H02M 2001/007; H02M 3/335; H02M 3/33569; H02M 7/53; H02M 7/537; H02M 7/538
See application file for complete search history.

(56) References Cited

U.S. PATENT DOCUMENTS

| | | | |
|---|---|---|---|
| 9,178,435 B2 * | 11/2015 | Nishimura | ........ H02M 3/33592 |
| 2005/0024803 A1 | 2/2005 | Ying et al. | |
| 2013/0223104 A1 | 8/2013 | Tian et al. | |
| 2015/0280589 A1 | 10/2015 | Schekulin et al. | |

OTHER PUBLICATIONS

German-language Written Opinion (PCT/ISA/237) issued in PCT Application No. PCT/EP2016/059059 dated Jun. 28, 2016 (five pages).

* cited by examiner

DC-DC CONVERTER

FIELD OF THE INVENTION

The invention relates to a DC-DC converter.

BACKGROUND AND SUMMARY OF THE INVENTION

In DC-DC converters (also called DC choppers), for example in the form of push-pull forward converters, the stray inductances of the usually used transformers in conjunction with the commutation behavior of the secondary-side rectifier diodes produce switching overvoltages across the power semiconductors, which switching overvoltages would lead to destruction of the power semiconductors if not limited or would require extreme oversizing of the dielectric strength.

Conventionally, RC elements are connected in parallel with the rectifier diodes of the DC-DC converters in order to damp the switching overvoltages. One disadvantage of this is the resulting heat loss in the damping resistors. Depending on the current load, switching energy, temperature etc., this can result in considerable problems in respect of heat dissipation which can lead to the achievable output current being limited.

The invention is based on the problem of providing a DC-DC converter which ensures effective protection switching overvoltages and which at the same time produces as little electrical loss as possible.

The invention solves this problem by virtue of a DC-DC converter comprising: an output terminal, wherein the output terminal comprises a first output terminal pin and a second output terminal pin; a number of rectifier elements; a voltage limiting unit comprising an electrical energy store, wherein the voltage limiting unit is designed to limit voltages across the rectifier elements; and a clocked energy regulator unit which is designed to regulate at a setpoint value energy which is stored in the electrical energy store.

The invention relates to a DC-DC converter, in particular in the form of a push-pull forward converter. The DC-DC converter can be of unidirectional or bidirectional design.

The DC-DC converter has an output terminal, wherein the output terminal has a first output terminal pin (positive pole) and a second output terminal pin (negative pole). A higher potential can be produced at the first output terminal pin than at the second output terminal pin. Here, the term "output" is not intended to be understood in a restrictive manner to the effect that it necessarily has to be a unidirectional DC-DC converter comprising a dedicated input and output. In the case of a bidirectional DC-DC converter, the output terminal is one of the two (non-directional) outer terminals.

The DC-DC converter further has a number of (for example between 2 and 4) rectifier elements.

The DC-DC converter further has a, in particular passive, voltage limiting unit (overvoltage protection unit). The voltage limiting unit is designed to limit or to reduce (over) voltages across the rectifier elements. The voltage limiting unit has an electrical energy store which is designed to at least partially buffer-store energy which originates from voltage peaks due to switching processes.

The DC-DC converter further has a clocked energy regulator unit which is coupled to the voltage limiting unit and is designed to limit and/or regulate at a setpoint value energy which is stored in the electrical energy store or a voltage which is present at the energy store by the energy regulator unit transmitting, for example, energy which is stored in the energy store in the direction of the output terminal when the energy which is stored in the energy store exceeds an energy setpoint value or a voltage which is present at the energy store exceeds a voltage threshold value. The energy regulator unit may comprise a clocked switching means, wherein a clock of the switching means can differ from an operating clock of the DC-DC converter.

The energy regulator unit allows switching energy to be provided in a regenerative manner, for example, at the output terminal, without the switching energy being converted into heat in a dissipative manner in a resistor. Effective overvoltage limiting is ensured at the same time.

The clocked energy regulator unit may comprise a (clocked) DC chopper (can generally also be called a clocked chopper), for example in the form of an inverse converter, which is designed to transmit energy which is stored in the electrical energy store in the direction of the output terminal. The DC chopper can function as an actuator in the context of energy or voltage regulation, for example by transmitting energy in the direction of the output terminal only when the energy which is stored in the electrical energy store exceeds a setpoint value. The DC chopper can be, for example, an inverting or a non-inverting buck converter or boost converter.

The DC-DC converter may comprise a, for example DC-isolating, transformer. The transformer has, in addition to one, two or more primary windings, at least one secondary winding, wherein the rectifier elements are designed to rectify one or more voltages across the at least one secondary winding.

The transformer may comprise precisely one first secondary winding and precisely one second secondary winding, wherein the rectifier elements are designed to rectify voltages across the first and the second secondary winding.

The rectifier elements can be diodes. As an alternative, the rectifier elements can also be transistors, for example MOSFETs, as a result of which synchronous rectification is possible.

The DC-DC converter may comprise an inductive component, for example in the form of a coil or inductor. A first terminal of the first secondary winding and a first terminal of the second secondary winding can be indirectly (with further interposed components) or directly (without further interposed components) electrically connected to the second output terminal pin. The first rectifier element and the inductive component can be looped in between a second terminal of the first secondary winding and the first output terminal pin. The second rectifier element can be looped in between a second terminal of the second secondary winding and a connecting node of the first rectifier element and of the inductive component.

The voltage limiting unit may comprise a first diode and a second diode. The electrical energy store can be a capacitor or comprise a capacitor. The anode of the first diode and the anode of the second diode can be electrically connected to a first terminal of the capacitor. The cathode of the first diode can be electrically connected to the second terminal of the first secondary winding. The cathode of the second diode can be electrically connected to the second terminal of the second secondary winding. A second terminal of the capacitor can be electrically connected to a connecting node of the first rectifier element, of the second rectifier element and of the inductive component.

The energy regulator unit may comprise a decoupling diode and a charge transfer capacitor. The cathode of the decoupling diode can be electrically connected to the anode of the first diode and to the anode of the second diode. A first terminal of the charge transfer capacitor can be electrically connected to the anode of the decoupling diode. A second terminal of the charge transfer capacitor can be electrically connected to the second output terminal pin. A first input terminal pin of the DC chopper can be electrically connected to the cathode of the decoupling diode. A second input terminal pin of the DC chopper can be electrically connected to the first terminal of the first secondary winding, to the first terminal of the second secondary winding and to the second output terminal pin.

In an alternative embodiment, the DC-DC converter may comprise an inductive component, for example in the form of an inductor or coil, wherein the inductive component is looped in between a connecting node of a first terminal of the first secondary winding and of a first terminal of the second secondary winding and the first output terminal pin. The first rectifier element can be looped in between a second terminal of the second secondary winding and the second output terminal pin. The second rectifier element can be looped in between a second terminal of the first secondary winding and the second output terminal pin.

In this case, the voltage limiting unit may comprise a first diode and a second diode. The electrical energy store can be a capacitor. The cathode of the first diode and the cathode of the second diode can be electrically connected to a first terminal of the capacitor. The anode of the first diode can be electrically connected to the second terminal of the first secondary winding. The anode of the second diode can be electrically connected to the second terminal of the second secondary winding. A second terminal of the capacitor can be connected to the second output terminal pin.

A first input terminal pin of the DC chopper can be electrically connected to the cathode of the first diode, to the cathode of the second diode and to the first terminal of the capacitor. A second input terminal pin of the DC chopper can be electrically connected to the second output terminal pin and to the second terminal of the capacitor.

The transformer may comprise at least one primary winding. The DC-DC converter may comprise at least one clocked half-bridge circuit which is designed to apply a voltage which varies over time or a current which varies over time to at least one primary winding. In this case, the DC-DC converter (or a control unit of the DC-DC converter) is designed to set a switching frequency of the at least one half-bridge circuit independently of a switching frequency of the clocked energy regulator unit or of the DC chopper and/or to set switching phases of the at least one half-bridge circuit independently of switching phases of the clocked energy regulator unit or of the DC-DC converter. By way of example, the half-bridge circuit can carry out a pulse width modulation and the energy regulator unit can likewise carry out a pulse width modulation, wherein both the respective period durations and also the respective duty cycles of the pulse width modulation can be set independently of one another.

The transformer may comprise a first primary winding and a second primary winding. The DC-DC converter may comprise a first clocked half-bridge circuit and a second clocked half-bridge circuit, wherein the first clocked half-bridge circuit is designed to apply a voltage which varies over time or a current which varies over time to the first primary winding, and the second clocked half-bridge circuit is designed to apply a voltage which varies over time or a current which varies over time to the second primary winding. In this case, the DC-DC converter is designed to set a switching frequency of the first clocked half-bridge circuit and of the second clocked half-bridge circuit independently of a switching frequency of the clocked energy regulator unit or of the DC chopper and/or to set switching phases of the first clocked half-bridge circuit and of the second clocked half-bridge circuit independently of switching phases of the clocked energy regulator unit or of the DC chopper.

BRIEF DESCRIPTION OF THE DRAWINGS

The invention is described in detail below with reference to the drawings, in which.

DETAILED DESCRIPTION OF THE EMBODIMENTS

Figure 1:
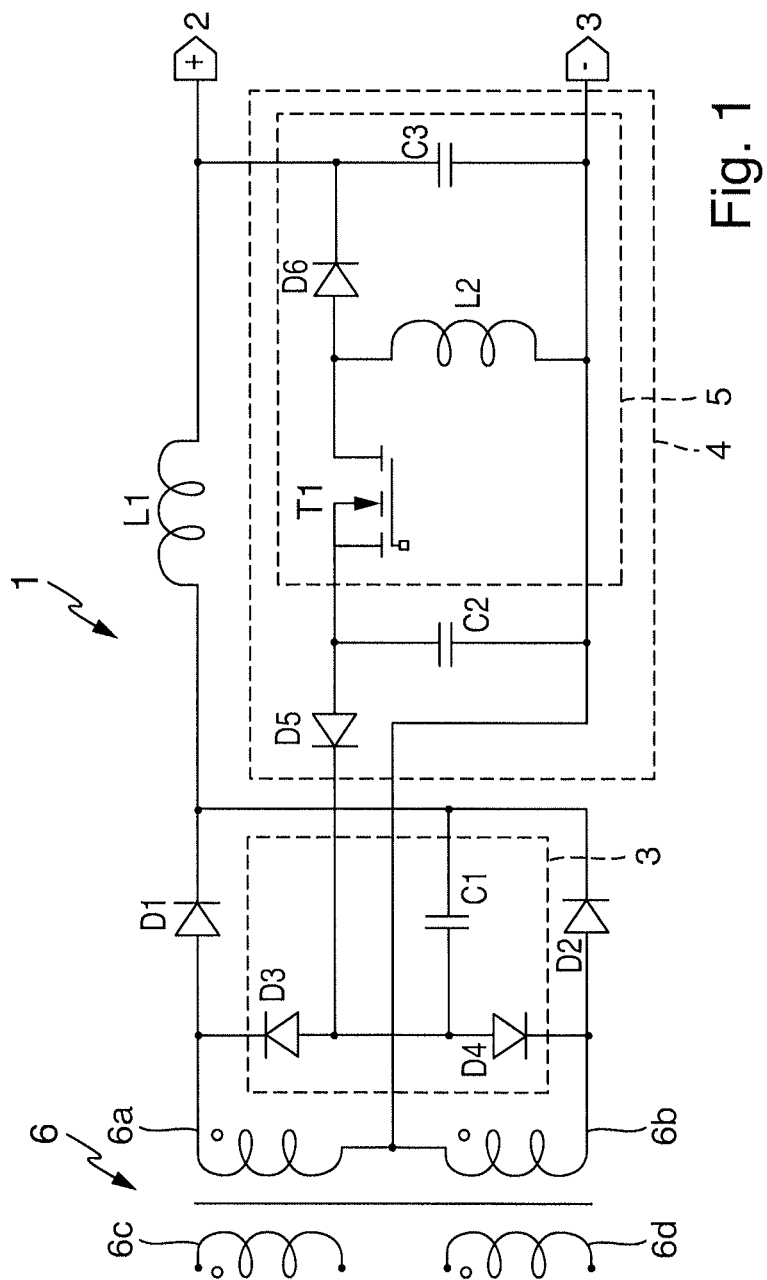
FIG. 1 shows a circuit diagram of a portion of a DC-DC converter according to the invention in accordance with a first embodiment.

FIG. 1 shows a circuit diagram of a secondary side of a DC-DC converter or forward converter 1 according to the invention in accordance with a first embodiment. The DC-DC converter 1 can be used, for example, as an on-board electrical system converter in a motor vehicle.

The DC-DC converter 1 has an (output) terminal, wherein the output terminal has a first (output) terminal pin 2 and a second (output) terminal pin 3. By way of example, an on-board electrical system voltage of 24 V DC or 48 V DC is applied between the terminal pins 2 and 3.

Figure 5:
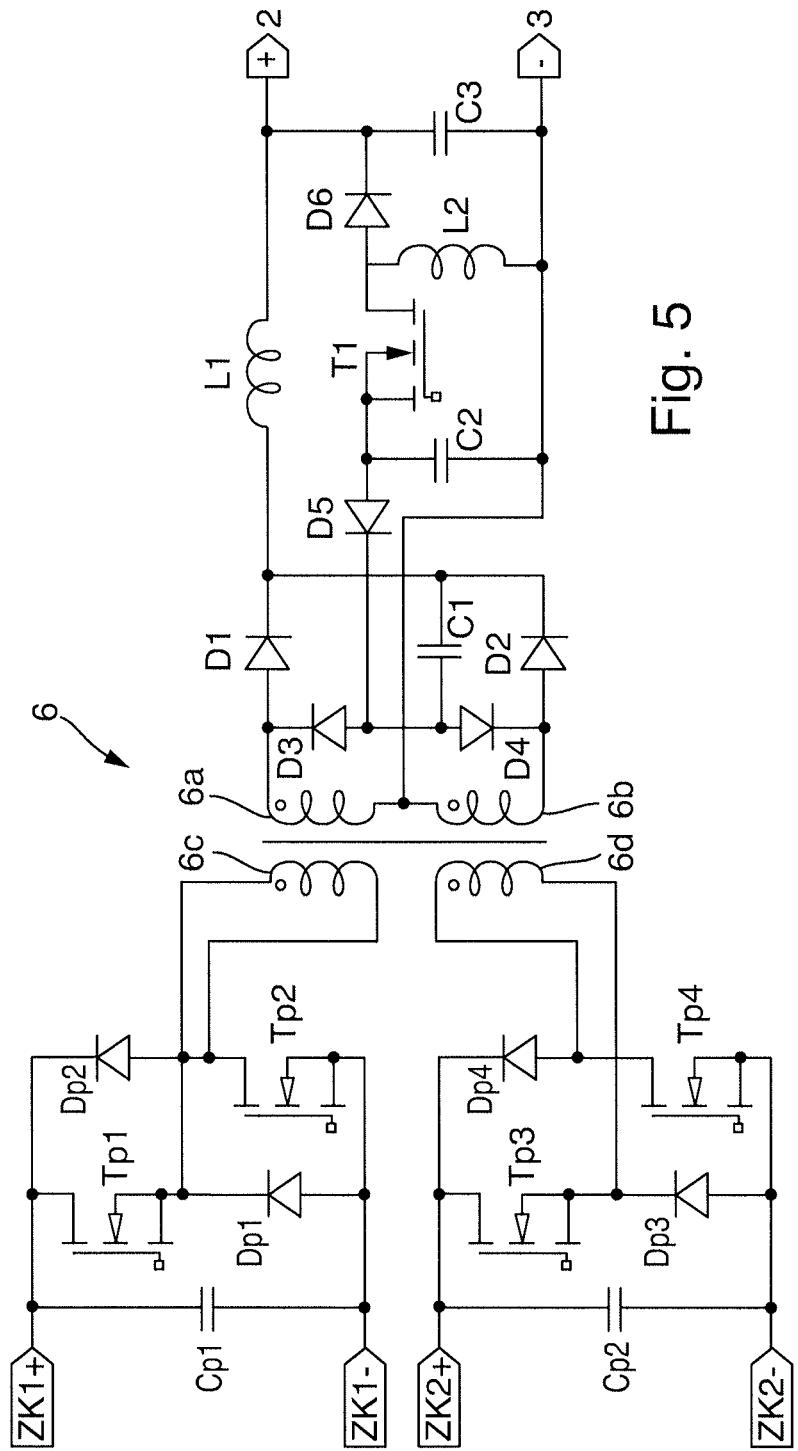
FIG. 5 shows a circuit diagram of a primary-side transformer circuit arrangement of the DC-DC converter shown in FIG. 1.

The DC-DC converter 1 has two rectifier elements in the form of two diodes D1 and D2. The diodes D1 and D2 serve to rectify voltages across secondary windings 6a and 6b of a transformer 6. AC voltages which are produced, for example, from an intermediate circuit voltage having a level of 400 V DC or 800 V DC are conventionally applied to the primary windings 6c and 6d of the transformer 6. Reference is also made to FIG. 5 in this respect.

The DC-DC converter 1 further has a passive voltage limiting unit or clamping circuit 3 comprising an electrical energy store in the form of a capacitor C1 and diodes D3 and D4. The anode of the diode D3 and the anode of the diode D4 are electrically connected to a first terminal of the capacitor C1. The cathode of the diode D3 is electrically connected to the second terminal of the first secondary winding 6a. The cathode of the diode D4 is electrically connected to the second terminal of the second secondary winding. A second terminal of the capacitor C1 is electrically connected to a connecting node of the diode D1 and of the diode D2. The voltage limiting unit 3 is designed to limit voltages across the rectifier diodes D1 and D2.

The DC-DC converter 1 further has an energy regulator unit 4 which is designed to limit or to regulate at a setpoint value energy which is stored in the capacitor C1 by excess energy being transmitted in the direction of the terminal pins 2 and 3, where it can be drawn, for example, by an electrical load, not illustrated in any more detail.

To this end, the energy regulator unit 4 has a DC chopper (can also be called chopper) in the form of a voltage-inverting buck converter (inverse converter) 5 which is designed to transmit energy which is stored in the electrical energy store C1 in the direction of the terminal pins 2 and 3.

The DC-DC converter 1 further has an inductive component in the form of a coil or inductor L1, wherein a first terminal of the first secondary winding 6a and a first terminal of the second secondary winding 6b (center tap of the transformer 6) are electrically connected to the second output terminal pin 3.

The diode D1 in the forward direction and the inductive component L1 are looped in between a second terminal of the first secondary winding 6a and the first output terminal pin 2. The diode D2 is, in the forward direction, looped in between a second terminal of the second secondary winding 6b and a connecting node of the diode D1 and of the coil L1.

The energy regulator unit 4 further has a decoupling diode D5 and a charge transfer capacitor C2. The cathode of the decoupling diode D5 is electrically connected to the anode of the diode D3 and to the anode of the diode D4 and also to a terminal of the capacitor C1. A first terminal of the charge transfer capacitor C2 is electrically connected to the anode of the decoupling diode D5. A second terminal of the charge transfer capacitor C2 is electrically connected to the second output terminal pin 3 and to the center tap of the transformer 6.

A first input terminal pin of the buck converter 5 is electrically connected to the anode of the decoupling diode D5 and a second input terminal pin of the buck converter 5 is electrically connected to the first terminal of the first secondary winding 6a, to the first terminal of the second secondary winding 6b (center tap of the transformer 6) and to the second output terminal pin 3.

The components D3, D4 and C1 of the voltage limiting unit 3 form a passive clamping circuit for reliable voltage limiting of the rectifier diodes D1 and D2. The energy from the commutation process is stored in the capacitor C1 in this case.

The diode D5 is used to decouple the potentials of the clamping circuit 3 to the capacitor C2. Both C1 and C2 carry approximately twice the secondary voltage of the transformer 6.

The downstream step-down or inverse converter 5, comprising components in the form of a transistor T1, a coil or inductor L2 and a diode D6, keeps the voltage across the capacitor C2 and therefore also across the capacitor C1 constant and can operate in an asynchronous manner to the clock frequency of the power path of the forward converter 1 and can be operated, for example, at a switching frequency of between 50 and 100 kHz. Therefore, the energy produced or present in the clamping circuit 3 can be transferred to the output side with a low level of loss and stored in a capacitor C3.

The overvoltage limiting is performed by means of a robust passive network. The circuits for overvoltage clamping and feedback are functionally decoupled by means of the diode D5. Therefore, separate optimization of the respective components is possible.

Figure 2:
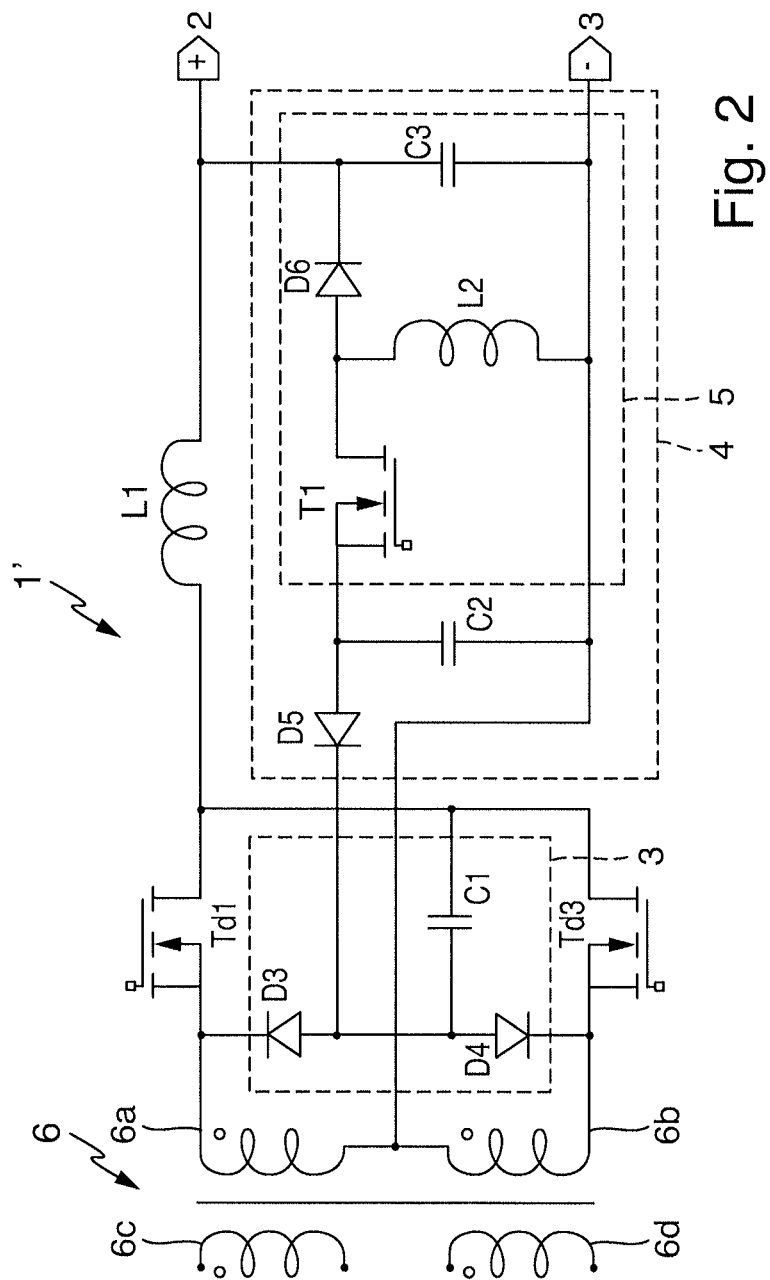
FIG. 2 shows a circuit diagram of a portion of a DC-DC converter according to the invention in accordance with a further embodiment.

FIG. 2 shows a circuit diagram of a secondary side of a DC-DC converter or forward converter 1' according to the invention in accordance with a further embodiment.

The only difference in comparison with the embodiment shown in FIG. 1 is that the diodes D1 and D2 are replaced by MOSFETs Td1 and Td3, as a result of which synchronous rectification and bidirectional DC-DC converter operation are possible.

Figure 3:
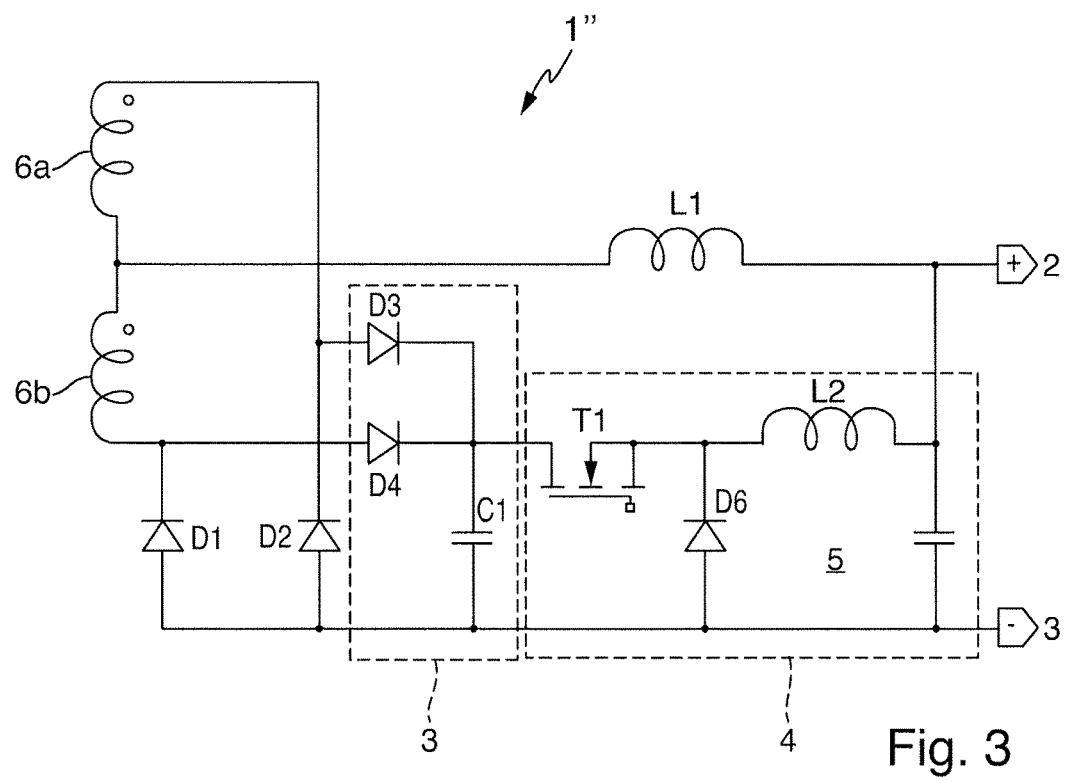
FIG. 3 shows a circuit diagram of a portion of a DC-DC converter according to the invention in accordance with a further embodiment.

FIG. 3 shows a circuit diagram of a secondary side of a DC-DC converter or forward converter 1" according to the invention in accordance with a further embodiment.

In this embodiment, the cathode of the diode D3 and the cathode of the diode D4 are electrically connected to the first terminal of the capacitor C1. The anode of the diode D3 is electrically connected to the second terminal of the first secondary winding 6a. The anode of the diode D4 is electrically connected to the second terminal of the second secondary winding 6b. The second terminal of the capacitor C1 is electrically connected to the second output terminal pin 3.

A first input terminal pin of the energy regulator unit 4 and, respectively, of the buck converter 5 is electrically connected to the cathode of the diode D3, to the cathode of the diode D4 and to the first terminal of the capacitor C1. A second input terminal pin of the buck converter 5 is electrically connected to the respective anodes of the diodes D1 and D2, to the second terminal of the capacitor C1 and to the second output terminal pin 3.

In the embodiment shown in FIG. 3, the diodes D2 and D3 can be replaced by transistors, as in FIG. 2.

Figure 4:
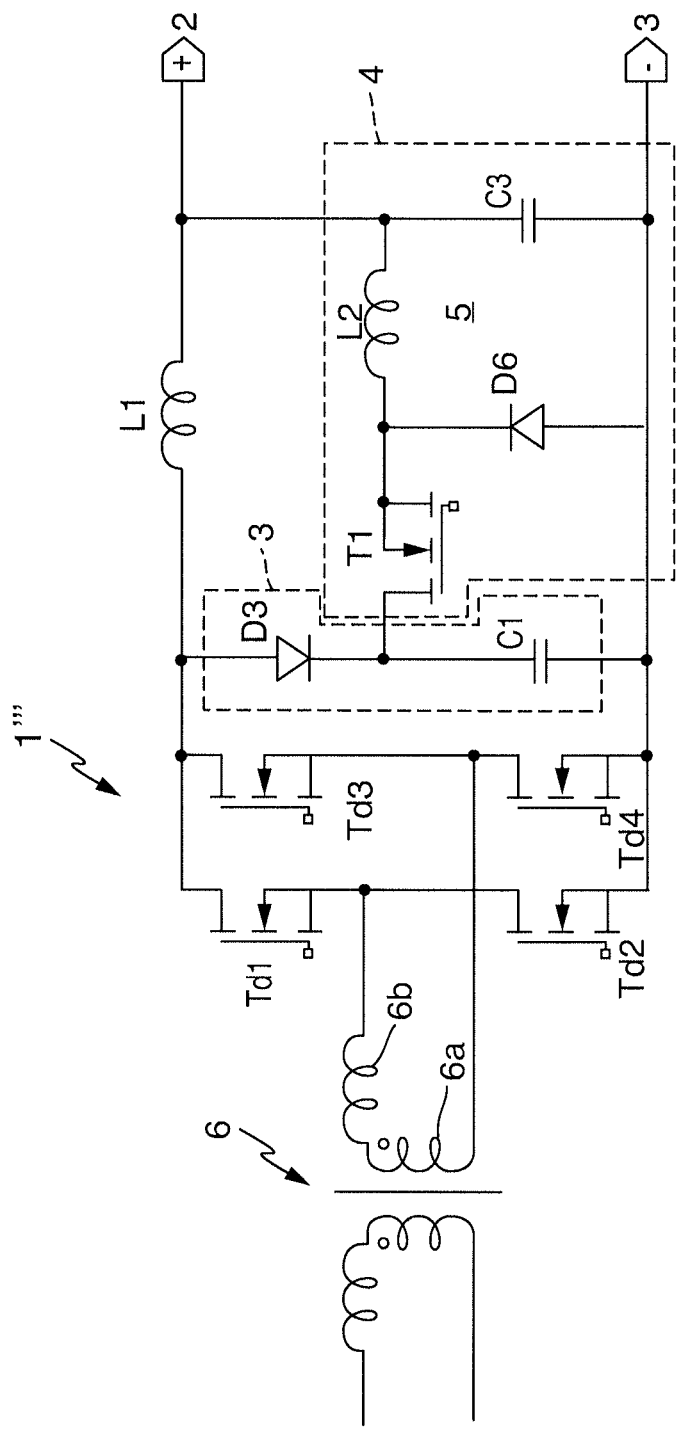
FIG. 4 shows a circuit diagram of a portion of a DC-DC converter according to the invention in accordance with a further embodiment.

FIG. 4 shows a circuit diagram of a secondary side of a DC-DC converter or forward converter 1''' according to the invention in accordance with a further embodiment. The DC-DC converter 1''' can be used, for example, in a 48 V on-board electrical system, whereas the embodiments shown in FIGS. 1 to 3 are preferably used in 24 V on-board electrical systems.

In the DC-DC converter 1''', the two secondary windings 6a and 6b are connected in series. A synchronous bridge rectifier comprising the MOSFETs Td1 to Td4 is used to generate the 48 V output voltage. The commutation energy which is stored in C1 can be directly transmitted to the output capacitor C3 by means of the buck converter 5 since there is no "middle potential". Diodes can also be used instead of the MOSFETs Td1 to Td4 if synchronous rectification and bidirectional operation are not necessary.

The voltage limiting unit or clamping circuit 3 according to the invention serves to limit voltage, wherein the "clamped" energy is temporarily stored in a capacitor C1 and made available to the secondary side (consumer side) via the buck converter 5. Regenerative overvoltage clamping instead of overvoltage damping can be realized in this way.

It goes without saying that a different suitable DC chopper can be used instead of the buck converter 5 depending on prevailing voltage levels and circuit topology.

FIG. 5 shows a circuit diagram of a primary-side transformer circuit arrangement of the DC-DC converter 1 shown in FIG. 1. It goes without saying that the primary-side transformer circuit arrangement illustrated can also be used in the embodiments of FIGS. 2 to 4.

The two independent primary windings 6c and 6d are driven by a first asymmetrical half-bridge circuit Tp1, Tp2, Dp1, Dp2, Cp1 and, respectively, a second asymmetrical half-bridge circuit Tp3, Tp4, Dp3, Dp4, Cp2, where the index p denotes primary side.

The semiconductor switches or transistors Tp1 and Tp2 and, respectively, Tp3 and Tp4 of the respective half-bridges are synchronously driven, that is to say Tp1 and Tp2 are switched on/off at the same time and Tp3 and Tp4 are switched on/off at the same time. The two half-bridges are preferably clocked with a phase offset of 180 degrees in relation to one another. The half-bridges can be interconnected in series or in parallel. In the case of parallel terminal, an identical number of turns of the primary windings is required. The variables ZK1+ and ZK2+ denote positive intermediate circuit potentials and the variables ZK1− and ZK2− denote negative intermediate circuit potentials.

The operation of the energy regulator unit 4 and, respectively, of the DC chopper 5 is explained in greater detail below.

The DC chopper 5 does not serve for reducing the total output current and reducing the physical size of the output capacitor C3, but rather for regenerative overvoltage clamping instead of overvoltage damping.

Here, the DC chopper 5 is operated independently of the main controller (comprising, amongst other things, the primary-side half-bridges, the transformer 6, the rectifier elements D1 and D2 and the inductive component or the inductor L1).

By way of example, the output current of the DC chopper 5 and, respectively, the inductor current through L2 can be selected completely independently of the current through L1, in particular independently of current fluctuations in the current through L1.

Furthermore, a switching frequency of the transistor T1 can be independent of a switching frequency of the semiconductor switches Tp1 to Tp4.

Furthermore, switching phases of the transistor T1 can be independent of switching phases of the semiconductor switches Tp1 to Tp4.

The DC chopper 5 is preferably operated with a continuous current flow through the inductor L2. This manner of operation allows for a minimal physical size of the inductor L2 of the DC chopper. Furthermore, this manner of operation allows for reduced losses in the semiconductors T1 and D6 as a result of a favorable ratio of AV and RMS currents [AV=arithmetic mean value; RMS=root mean square value] and therefore a reduced physical size of the entire DC chopper 5.

In a lower partial load range, the DC chopper 5 is operated either in the discontinuous range or in the intermittent mode. Synchronous operation is not required in this case either.

Figure 6:
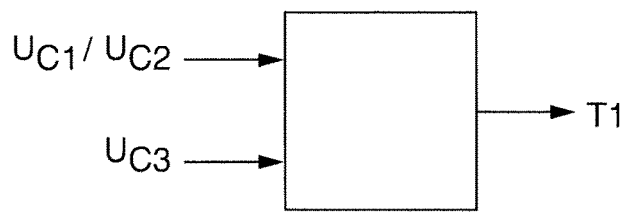
FIG. 6 shows a block diagram of a control signal generation operation.

With reference to FIG. 6, the only regulation criterion for the step-down or inverse converter 5 is a voltage across the (voltage limiting) capacitor C1 or an input voltage of the DC chopper (voltage across C1 or C2) and a voltage across the capacitor C3.

In the continuous operating mode, the voltage conversion ratio of the DC chopper 5 can be set by a duty cycle of the drive signal of T1.

Figure 7:
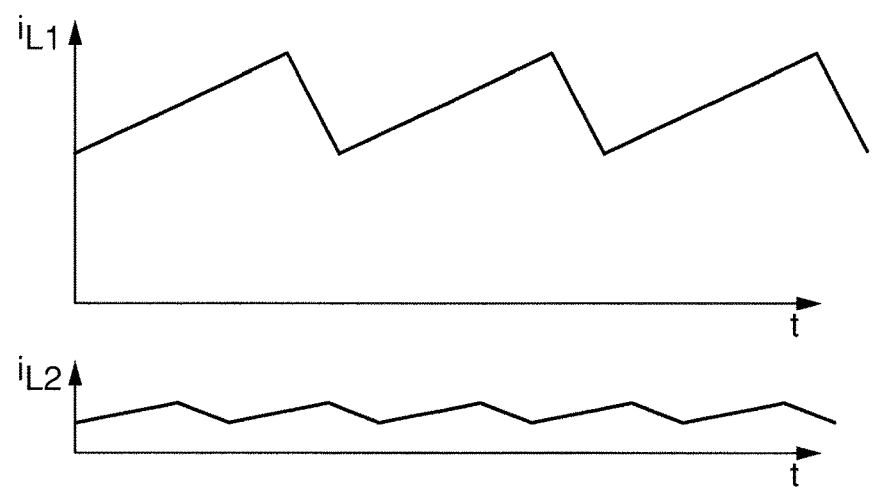
FIG. 7 shows time/current profiles through different inductors of the DC-DC converter.

FIG. 7 shows time/current profiles through the inductors L1 and, respectively, L2 of the DC-DC converter under full load. As is clear from FIG. 7, the currents run asynchronously or randomly in relation to one another since the transistor T1 is clocked independently of the transistors Tp1 and Tp2 and, respectively, Tp3 and Tp4 of the primary-side half bridges.

Figure 8:
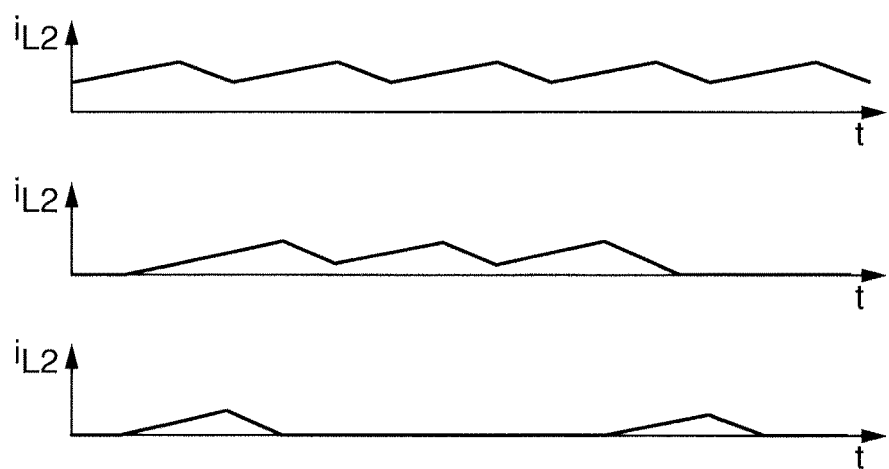
FIG. 8 shows a time/current profile through an inductor of a DC chopper of the DC-DC converter.

FIG. 8 shows the time/current profile through the inductor L2 for different load situations, that is to say operation under full load at the top, operation under partial load with intermittent operation in the middle, and operation under partial load with discontinuous operation at the bottom.

An average current through L1 is typically 200 A in the case of a full load. However, a current through L2 is typically 10 A in the case of a full load.

What is claimed is:

1. A DC-DC converter, comprising:
an output terminal, wherein the output terminal comprises a first output terminal pin and a second output terminal pin;
a number of rectifier elements;
a voltage limiting unit comprising an electrical energy store, wherein the voltage limiting unit is designed to limit voltages across the rectifier elements;
a clocked energy regulator unit which is designed to regulate at a setpoint value energy which is stored in the electrical energy store;
a transformer comprising at least one secondary winding, the at least one secondary winding including a first secondary winding and a second secondary winding and the rectifier elements being designed to rectify voltages across the first secondary winding and the second secondary winding; and
an inductive component,
wherein
the rectifier elements are diodes or transistors,
a first terminal of the first secondary winding and a first terminal of the second secondary winding are electrically connected to the second output terminal pin,
the first rectifier element and the inductive component are looped in between a second terminal of the first secondary winding and the first output terminal pin,
the second rectifier element is looped in between a second terminal of the second secondary winding and a connecting node of the first rectifier element and of the inductive component,
the voltage limiting unit comprises a first diode and a second diode,
the electrical energy store is a capacitor,
the anode of the first diode and the anode of the second diode are electrically connected to a first terminal of the capacitor,
the cathode of the first diode is electrically connected to the second terminal of the first secondary winding,
the cathode of the second diode is electrically connected to the second terminal of the second secondary winding, and
a second terminal of the capacitor is electrically connected to a connecting node of the first rectifier element, of the second rectifier element and of the inductive component,
the energy regulator unit comprises a DC chopper which is designed to transmit energy which is stored in the electrical energy store in the direction of the output terminal, a decoupling diode and a charge transfer capacitor,
the cathode of the decoupling diode is electrically connected to the anode of the first diode and to the anode of the second diode,
a first terminal of the charge transfer capacitor is electrically connected to the anode of the decoupling diode,
a second terminal of the charge transfer capacitor is electrically connected to the second output terminal pin,
a first input terminal pin of the DC chopper is electrically connected to the anode of the decoupling diode, and a second input terminal pin of the DC chopper is electrically connected to the first terminal of the first secondary winding, to the first terminal of the second secondary winding and to the second output terminal pin.

2. The DC-DC converter as claimed in claim 1, wherein the transformer comprises at least one primary winding, and the DC-DC converter comprises at least one clocked half-bridge circuit which is designed to apply a voltage which varies over time or a current which varies over time to the at least one primary winding, wherein the DC-DC converter is designed to set a switching frequency of the at least one half-bridge circuit independently of a switching frequency of the clocked energy regulator unit and/or to set switching phases of the at least one half-bridge circuit independently of switching phases of the clocked energy regulator unit.

3. The DC-DC converter as claimed in claim 1, wherein the transformer comprises a first primary winding and a second primary winding, and the DC-DC converter comprises a first clocked half-bridge circuit and a second clocked half-bridge circuit, wherein the first clocked half-bridge circuit is designed to apply a voltage which varies over time or a current which varies over time to the first primary winding, and the second clocked half-bridge circuit is designed to apply a voltage which varies over time or a current which varies over time to the second primary winding, wherein the DC-DC converter is designed to set a switching frequency of the first clocked half-bridge circuit and of the second clocked half-bridge circuit independently of a switching frequency of the clocked energy regulator unit and/or to set switching phases of the first clocked half-bridge circuit and of the second clocked half-bridge circuit independently of switching phases of the clocked energy regulator unit.

\* \* \* \* \*